US012804819B2

(12) United States Patent
Wang

(10) Patent No.: US 12,804,819 B2
(45) Date of Patent: Nov. 17, 2026

(54) SYSTEM AND PROCESS FOR MANUFACTURING FLEXIBLE CIRCUIT BOARD BY LASER CUTTING

(71) Applicant: HUAIAN M & T NEW MATERIAL TECHNOLOGY CO., LTD, Huaian (CN)

(72) Inventor: Tonggang Wang, Huaian (CN)

(73) Assignee: HUAIAN M & T NEW MATERIAL TECHNOLOGY CO., LTD, Huaian (CN)

( * ) Notice: Subject to any disclaimer, the term of this patent is extended or adjusted under 35 U.S.C. 154(b) by 0 days.

(21) Appl. No.: 18/725,058

(22) PCT Filed: Jun. 15, 2023

(86) PCT No.: PCT/CN2023/100364
§ 371 (c)(1),
(2) Date: Jun. 27, 2024

(87) PCT Pub. No.: WO2024/234434
PCT Pub. Date: Nov. 21, 2024

(65) Prior Publication Data

US 2026/0150198 A1 May 28, 2026

(30) Foreign Application Priority Data

May 18, 2023 (CN) ......................... 202310563088.7

(51) Int. Cl.
*H05K 3/00* (2006.01)
*B23K 26/38* (2014.01)
*H05K 3/02* (2006.01)

(52) U.S. Cl.
CPC ............. *H05K 3/027* (2013.01); *B23K 26/38* (2013.01); *H05K 2203/107* (2013.01)

(58) Field of Classification Search
CPC ....... H05K 3/027; H05K 3/0026; B23K 26/18
See application file for complete search history.

(56) References Cited

U.S. PATENT DOCUMENTS 5,493,096 A * 2/1996 Koh .................... H10W 70/095 427/554
6,346,678 B1 * 2/2002 Kono .................. H05K 3/0035 174/262

(Continued)

FOREIGN PATENT DOCUMENTS

CN 110446371 A 11/2019
CN 112074087 A 12/2020

(Continued)

*Primary Examiner* — Matthew J Daniels
(74) *Attorney, Agent, or Firm* — Kilpatrick Townsend & Stockton LLP

(57) ABSTRACT

A system and process for manufacturing a flexible circuit board by laser cutting are provided. The process includes the steps of: S1, loading and adding protective layers, introducing a copper foil base layer, and laminating the protective layers to upper and lower surfaces of the copper foil base layer, respectively; S2, performing laser cutting on a semi-finished product treated in S1 to form a circuit structure; S3, removing scraps from the semi-finished product treated in S2, performing activated cleaning on the surfaces of the copper foil, and performing pseudo-lamination hot-pressing for; S4, performing combinational hot-pressing on the semi-finished product treated in S3; S5, performing a windowing operation on the semi-finished product treated in S4; and S6, detecting and coding the semi-finished product treated in S5.

10 Claims, 8 Drawing Sheets

(56) References Cited

U.S. PATENT DOCUMENTS

| | | | | |
|---|---|---|---|---|
| 2003/0160035 | A1 * | 8/2003 | Gregory | H10W 99/00 219/121.69 |
| 2006/0246279 | A1 * | 11/2006 | Urairi | H05K 3/0029 428/343 |
| 2011/0108310 | A1 * | 5/2011 | Onozeki | H05K 3/022 29/829 |
| 2014/0065356 | A1 * | 3/2014 | Chow | B23K 26/50 219/121.68 |
| 2014/0202742 | A1 * | 7/2014 | Jones | H10F 71/138 174/253 |
| 2015/0289378 | A1 * | 10/2015 | Jung | H05K 3/10 174/250 |
| 2016/0324007 | A1 * | 11/2016 | Hirose | B32B 27/30 |
| 2020/0246910 | A1 * | 8/2020 | Bucklew | B23K 26/046 |
| 2022/0338357 | A1 * | 10/2022 | Kawagoe | H05K 1/113 |
| 2023/0089856 | A1 * | 3/2023 | Li | H05K 1/0274 174/262 |

FOREIGN PATENT DOCUMENTS

| | | | |
|---|---|---|---|
| CN | 114900965 | A | 8/2022 |
| CN | 115413134 | A | 11/2022 |
| CN | 115580990 | A | 1/2023 |
| WO | 2022096001 | A1 | 5/2022 |

* cited by examiner

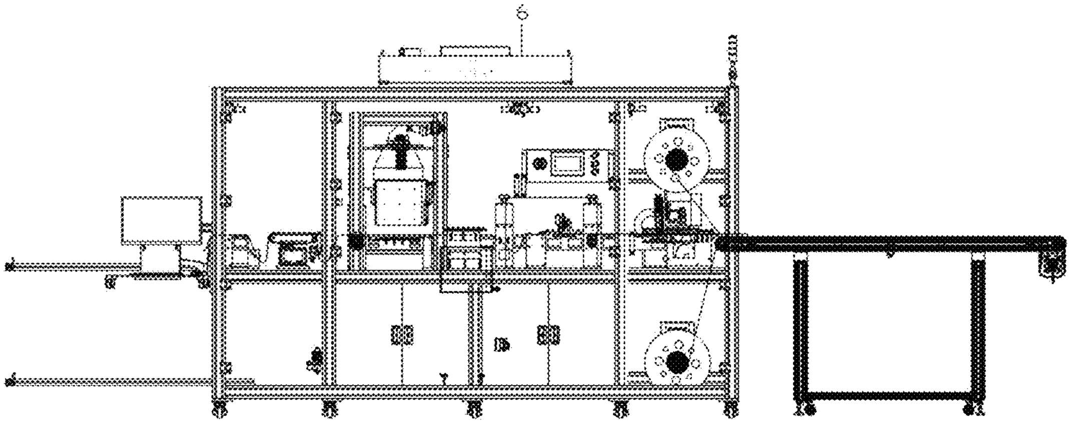
Fig. 7
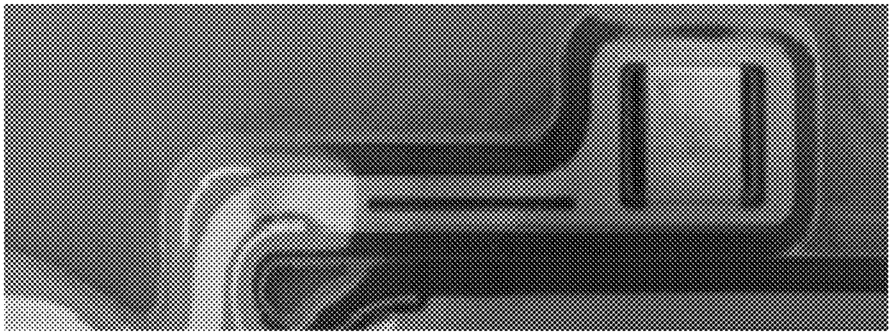
Fig. 8
| No. | Width (mm) | Maximum interval peel force (gf) | Minimum interval peel force (gf) | Mean interval peel force (gf) |
|---|---|---|---|---|
| 1 | -0.00 | 1774.03 | 1294.50 | 1512.00 |
| 2 | -0.00 | 1760.06 | 1403.06 | 1565.93 |
| 3 | -0.00 | 1850.54 | 1377.56 | 1563.58 |
| 4 | -0.00 | 1785.05 | 1396.51 | 1570.65 |
| 5 | -0.00 | 1992.58 | 1639.53 | 1837.79 |
| Maximum | --- | 1992.58 | 1639.53 | 1837.79 |
| Minimum | --- | 1760.06 | 1294.50 | 1512.00 |
| Mean | --- | 1832.45 | 1422.23 | 1609.99 |
Fig. 9

| Item | No.1 | No.2 | No.3 | No.4 | No.5 |
|---|---|---|---|---|---|
| Opening 1 | 34.1 | 27.33 | 32.07 | 31.45 | 29.53 |
| Opening 2 | 133.83 | 126.23 | 122.27 | 132.38 | 134.01 |
| Opening 3 | 428.42 | 432.64 | 434.64 | 432.39 | 430.48 |
| Opening 4 | 227.02 | 234.63 | 223.91 | 234.93 | 227.26 |
| Windowing position | 21.63 | 28.74 | 31.46 | 21.15 | 21.95 |

Fig. 11

| Item | No.1 | No.2 | No.3 | No.4 | No.5 |
|---|---|---|---|---|---|
| Fusing @ 7A | 0.72seconds | 0.68seconds | 0.59seconds | 0.68seconds | 0.62seconds |
| Overcurrent @ 1A | >300seconds | >300seconds | >300seconds | >300seconds | >300seconds |

Fig. 12

SYSTEM AND PROCESS FOR MANUFACTURING FLEXIBLE CIRCUIT BOARD BY LASER CUTTING

FIELD

The present invention relates to the technical field of new energy semiconductors, in particular to a system and process for manufacturing a flexible circuit board by laser cutting, directing to laser direct circuit (LDC) products.

BACKGROUND

LDC, also known as flexible circuit board, is favored for its excellent characteristics such as light weight, small thickness, and free bendability and foldability. The flexible circuit board has a printed circuit with high reliability and excellent flexibility, where the design of embedding the circuit in a light-weight bendable plastic sheet allows for stacking and embedding of a large number of precision components in a narrow and limited space, to thereby form a bendable flexible circuit. The flexible circuit board can be bent and folded freely with light weight, small size, good heat dissipation, and ease in installation, breaking through the traditional interconnection technology. In structure, the flexible circuit is composed of materials such as insulating films, conductors, and adhesives.

One of the main processes in the production of existing flexible circuit boards is developing-etching-film removing, in which developing is to remove a coverlay in a non-circuit region on a copper foil flexible circuit board to expose a coverlay in a circuit region; then, the copper foil in the non-circuit region is etched with an etching solution to remove undesired copper by reaction, thereby machining a circuit with a predetermined trajectory on the flexible circuit board; and finally, the coverlay is removed, and the etched flexible circuit board is cleaned and dried. For example, the existing Patent No. CN201711203417.8 discloses a process for manufacturing a FPC flexible wireless charging conveying coil module, including the steps of: S1, preparing a pure copper foil for machining, and cleaning a machining surface of the copper foil; S2, etching, by laser etching, a groove in the copper foil prepared in S1; S3, etching a channel, namely etching the channel in the machining surface of the copper foil after the groove is machined in S2; S4, performing pretreatment on the copper foil machined in S3; S5, laminating a base material on the surface of the copper foil; and S6, further etching the other end face of the laminated copper foil with respect to the base material.

However, this machining method leads to a chemical reaction between the copper foil in the FPC and the etching solution during etching, resulting in chemical waste. If the chemical waste is discharged directly, heavy metal pollution and the waste of metal in the chemical waste would be caused. If the metal in the chemical waste is recycled, the manufacturing cost will be increased due to a higher cost for recycling and treatment of polluting emissions.

SUMMARY

The present invention overcomes the defects in the prior art and provides a system and process for manufacturing a flexible circuit board by laser cutting, where by manufacturing the flexible circuit board by laser machining, the machining convenience and environmental friendliness of the flexible circuit board are optimized, the product performance of the flexible circuit board is improved, and the service life of the flexible circuit board is prolonged.

In order to achieve the object above, a technical solution used in the present invention is as follows: a process for manufacturing a flexible circuit board by laser cutting includes the steps of:

S1, loading and adding protective layers, introducing a copper foil base layer, and laminating the protective layers to upper and lower surfaces of the copper foil base layer, respectively;

S2, performing laser cutting on a semi-finished product treated in S1 to form a circuit structure;

S3, performing scrap removal, activated cleaning, and pseudo-lamination hot-pressing on the semi-finished product treated in S2;

S4, performing combinational hot-pressing on the semi-finished product treated in S3; and

S5, performing a windowing operation on the semi-finished product treated in S4 to expose soldering points of the copper foil base layer.

In a preferred embodiment of the present invention, in S1, the protective layer comprises a matt film or a bilayer protective film or a monolayer protective film; and with the bilayer protective film as a backing, the copper foil base layer is laminated to an upper surface of the bilayer protective film, and the matt film is then laminated on the copper foil base layer, and the monolayer protective film is laminated to a lower side of the bilayer protective film.

In a preferred embodiment of the present invention, in S3, the matt film, copper foil scraps, and the monolayer protective film are removed from the semi-finished product treated in S2; then, activated cleaning is performed on an outer surface of the copper foil base layer in the semi-finished product, and an upper coverlay and an upper-layer protective film are sequentially laminated to an upper surface of the copper foil base layer from inside to outside; and then, pseudo hot-pressing is performed on a lower layer of the semi-finished product at a temperature of 60-130° C.

In a preferred embodiment of the present invention, in S3, the bilayer protective film is removed from the lower layer of the semi-finished product subjected to the pseudo hot-pressing; then, activated cleaning is performed on the lower surface of the copper foil base layer in the semi-finished product, and a lower coverlay and a lower-layer protective film are sequentially laminated to a lower surface of the copper foil base layer from inside to outside; and then, pseudo hot-pressing is performed on an upper layer of the semi-finished product at a temperature of 60-130° C.

In a preferred embodiment of the present invention, in S3, hot-pressing is performed at a temperature of 60-130° C. on upper and lower sides of the semi-finished product with either side laminated with the upper coverlay and upper-layer protective film or the lower coverlay and lower-layer protective film.

In a preferred embodiment of the present invention, in S4, the upper-layer protective film and the lower-layer protective film of the semi-finished product treated in S3 are removed; then, an upper auxiliary hot-press film and a lower auxiliary hot-press film are laminated to upper and lower sides, respectively, a finished-product hot-pressing operation is then performed, and the upper auxiliary hot-press film and the lower auxiliary hot-press film are removed from the semi-finished product subjected to the finished-product hot-pressing operation, wherein finished-product hot-pressing is performed for 120-180 seconds at a temperature of 120-200° within a pressure range of 70-150 kg.

In a preferred embodiment of the present invention, the process further includes S6 following S5; and in S6, an image of the semi-finished product treated in S5 is taken and transmitted to an image mechanism for inspection, and the inspected finished product is then coded and discharged.

In a preferred embodiment of the present invention, a system for manufacturing a flexible laser circuit board includes a loading/film pre-laminating module, a laser etching module, a scrap-removing/pseudo-lamination hot-pressing module, a combinational hot-pressing module, a laser windowing module, and a scrap-removing/coding/checking/discharging module, which are sequentially arranged according to working procedures;

the copper foil base layer is introduced into the loading/film pre-laminating module for an operation in S1;

the semi-finished product treated in S1 is led out from the loading/film pre-laminating module and conveyed into the laser etching module for an operation in S2;

the semi-finished product treated in S1 is then led out from the laser etching module and conveyed into the scrap-removing/pseudo-lamination hot-pressing module for an operation in S3;

the semi-finished product treated in S3 is then led out from the scrap-removing/pseudo-lamination hot-pressing module and conveyed to the combinational hot-pressing module for an operation in S4;

the semi-finished product treated in S4 is then led out from the combinational hot-pressing module and conveyed to the laser windowing module for an operation in S5; and the semi-finished product treated in S5 is then led out from the laser windowing module and conveyed to the scrap-removing/coding/checking/discharging module for an operation in S6.

In a preferred embodiment of the present invention, the loading/film pre-laminating module includes a first conveying passage as well as a plurality of first feeding rollers and first film removing rollers, wherein the first feeding rollers and the first film removing rollers correspond to the first conveying passage, and a first induced draft mechanism is further disposed on the first conveying passage;

and/or, the laser etching module includes a second conveying passage, wherein a first induced draft conveying platform is disposed on the second conveying passage, and a laser etching machine corresponding to the first induced draft conveying platform is disposed on the first induced draft conveying platform;

and/or, the scrap-removing/pseudo-lamination hot-pressing module comprises a third conveying passage, a plurality of third feeding rollers and third film removing rollers, a lower-layer hot-pressing roller set for implementing lower-layer pseudo hot-pressing, an upper-layer hot-pressing roller set for implementing upper-layer pseudo hot-pressing, and a bilateral hot-pressing roller set for implementing hot-pressing on upper and lower sides in S3, wherein the third feeding rollers and the third film removing rollers correspond to the third conveying passage;

and/or, the combinational hot-pressing module comprises a fourth conveying passage, a plurality of fourth feeding rollers and fourth film removing rollers, and a split type (upper-lower roller type) finished-product hot-pressing mechanism for implementing finished-product hot-pressing in S4, wherein the fourth feeding rollers and fourth film removing rollers correspond to the fourth conveying passage;

and/or, the laser windowing module includes a fifth conveying passage and a laser windowing machine corresponding to the fifth conveying passage; and and/or, the scrap-removing/coding/checking/discharging module comprises a sixth conveying passage, as well as an image mechanism inspection mechanism, a coding mechanism, and a plurality to sixth scrap-removing rollers, all of which correspond to the sixth conveying passage.

In a preferred embodiment of the present invention, the matt film includes a polyester thin film, which is provided with a heat-blocking base film, and a high-temperature-resistant adhesive layer is disposed between the polyester thin film and the heat-blocking base film;

and/or, the bilayer protective film includes a base film and a polyester thin film, and a high-temperature-resistant adhesive layer is disposed between the base film and the polyester thin film;

and/or, thermosensitive adhesive film layers are used as the lower coverlay and the upper coverlay;

and/or, polyester thin films are used as backings for the lower-layer and upper-layer protective films and the monolayer protective film, and acrylic adhesive layers are applied to one side of each of the lower-layer and upper-layer protective films and of the monolayer protective film;

and/or, polyester thin films are used as backings for the upper and lower auxiliary hot-press films, and release agent layers are applied to either side of the upper and lower auxiliary hot-press films.

The present invention overcomes the defects existing in the background art.

The system and process for manufacturing a flexible circuit board by laser cutting disclosed by the present invention are directed to LDC products. By manufacturing the flexible circuit board by laser cutting, the present invention optimizes the machining convenience and environmental friendliness of the flexible circuit board, improves the product performance of the flexible circuit board and prolongs the service life of the flexible circuit board.

BRIEF DESCRIPTION OF THE DRAWINGS

The present invention will be further illustrated below in conjunction with the accompanying drawings and the embodiments.

FIG. 7 shows a schematic structural diagram of a serap-removing/coding/checking/discharging module according to a preferred embodiment of the present invention;

FIG. 8 shows the comparison between an appearance according to a preferred embodiment of the present invention and the prior art;

FIG. 9 shows a peel strength test table according to a preferred embodiment of the present invention;

FIG. 11 shows a conduction property test table according to a preferred embodiment of the present invention;

FIG. 12 shows a fuse overcurrent and fusing test in a circuit according to a preferred embodiment of the present invention;

DETAILED DESCRIPTION

Figure 1:
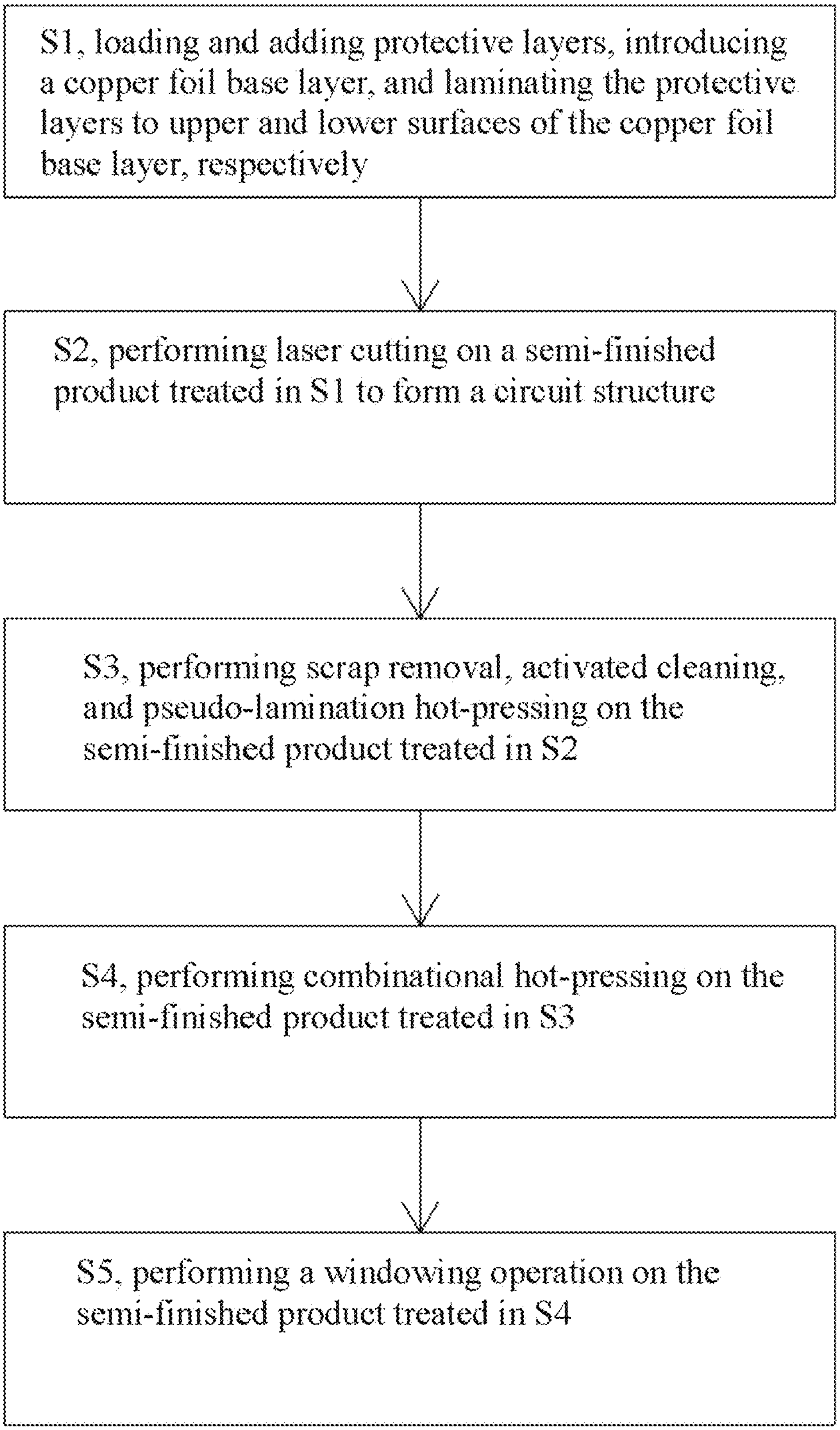
FIG. 1 shows a first process flowchart according to a preferred embodiment of the present invention.
Figure 2:
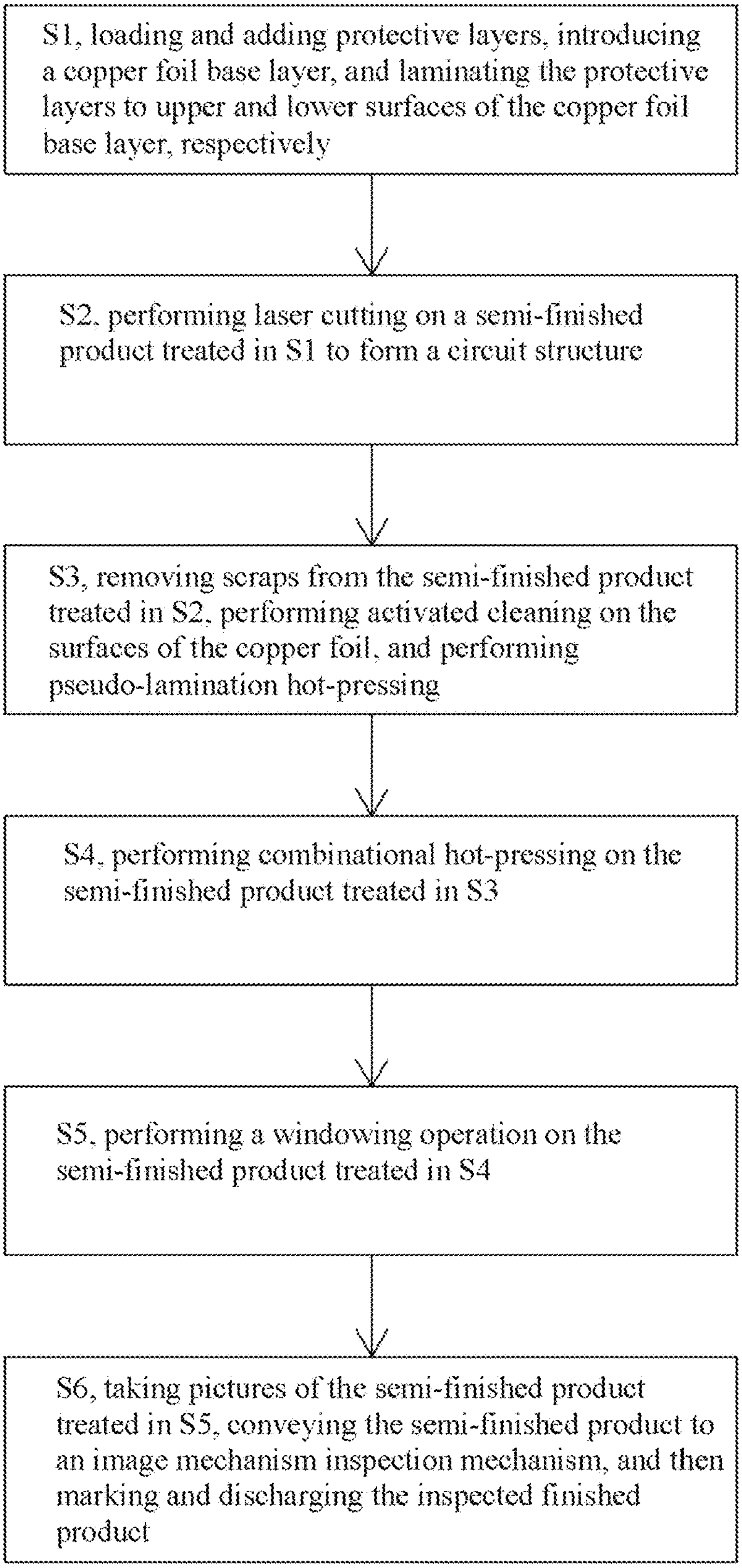
FIG. 2 shows a second process flowchart according to a preferred embodiment of the present invention.
Figure 3:
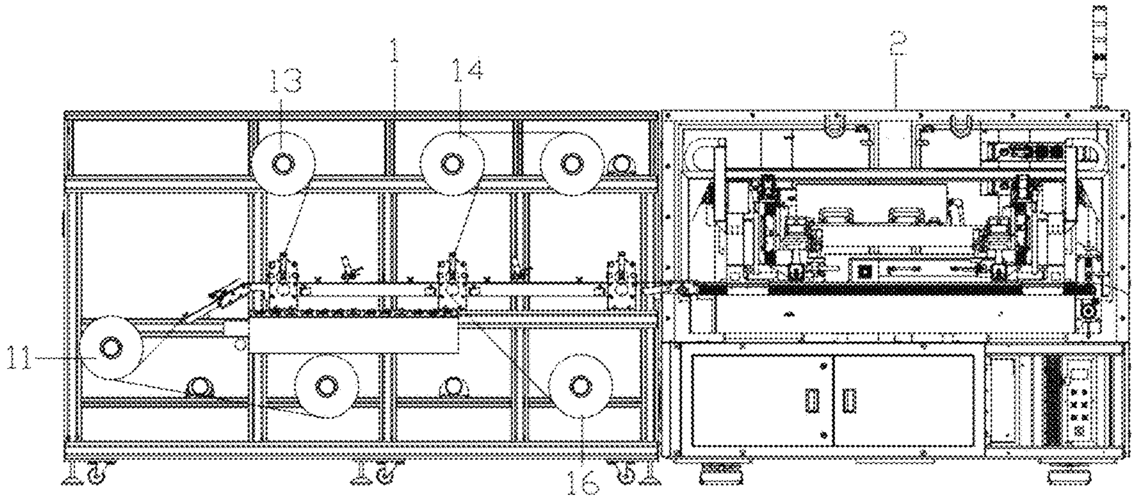
FIG. 3 shows a schematic structural diagram of a loading/film pre-laminating module and a laser etching module according to a preferred embodiment of the present invention.
Figure 4:
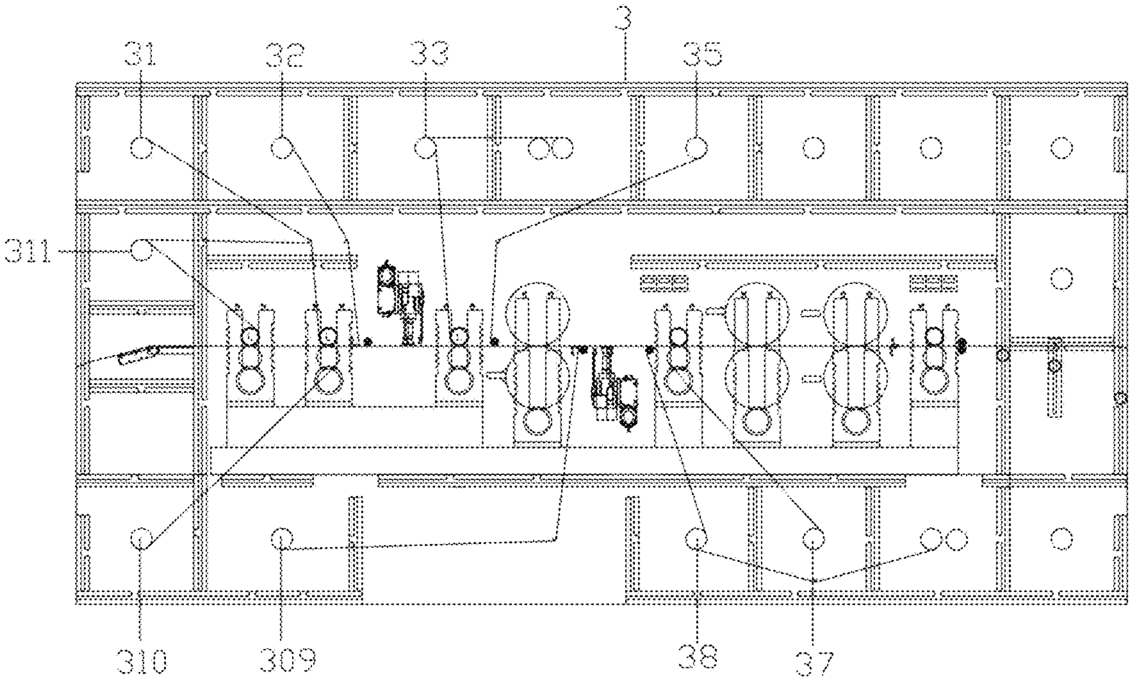
FIG. 4 shows a schematic structural diagram of a scrap-removing/pseudo-lamination hot-pressing module according to a preferred embodiment of the present invention.
Figure 5:
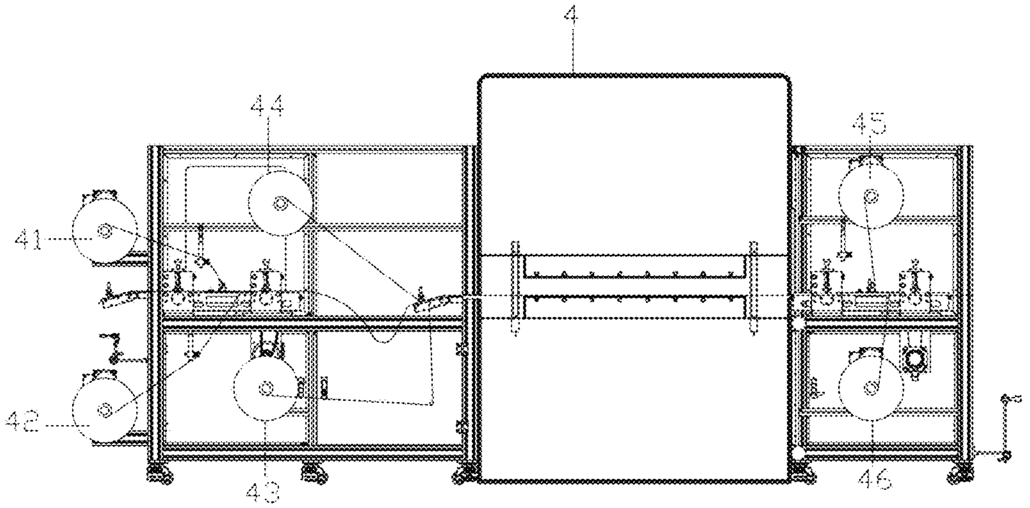
FIG. 5 shows a schematic structural diagram of a combinational hot-pressing module according to a preferred embodiment of the present invention.
Figure 6:
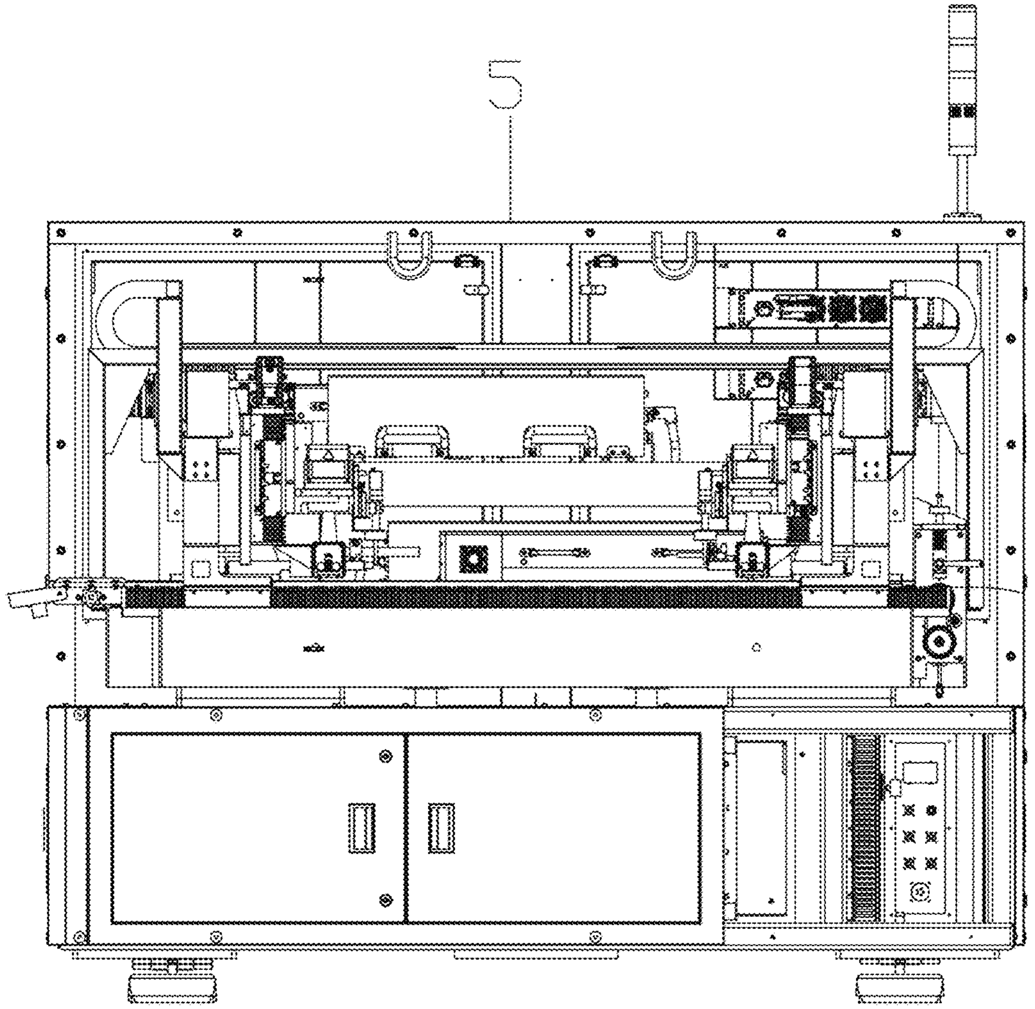
FIG. 6 shows a schematic structural diagram of a laser windowing module according to a preferred embodiment of the present invention.

The present invention is illustrated in further detail below in conjunction with the accompanying drawings and the embodiments. These accompanying drawings are simplified schematic diagrams to schematically illustrate the basic structure of the present invention, and thus only show the construction related to the present invention.

Embodiment 1

As shown in FIG. 1 to FIG. 7, a process for manufacturing a flexible circuit board by laser cutting includes the following steps.

In S1, protective layers are loaded and added; a copper foil base layer is introduced; and the protective layers are laminated to the upper and lower surfaces of the copper foil base layer, respectively. In S1, the protective layer comprises a matt film or a bilayer protective film or a monolayer protective film. Specifically, with the bilayer protective film as a backing, the copper foil base layer is laminated to an upper surface of the bilayer protective film, and the matt film is then laminated on the copper foil base layer, and the monolayer protective film is laminated to a lower side of the bilayer protective film.

In S2, laser printing and cutting is performed on a semi-finished product treated in S1 to form a circuit structure.

In S3, scrap removal, activated cleaning, and pseudo-lamination hot-pressing are performed on the semi-finished product treated in S2.

Specifically, the matt film, copper foil scraps, and the monolayer protective film are removed from the semi-finished product treated in S2; then, activated cleaning is performed on an outer surface of the copper foil base layer in the semi-finished product, and an upper coverlay and an upper-layer protective film are sequentially laminated to an upper surface of the copper foil base layer from inside to outside; and then, pseudo hot-pressing is performed on a lower layer of the semi-finished product at a temperature of 60-130° C., while normaltemperature and low pressure are applied to the other side. The bilayer protective film is removed from the lower layer of the semi-finished product subjected to the pseudo hot-pressing; then, activated cleaning is performed on the lower surface of the copper foil base layer in the semi-finished product, and a lower coverlay and a lower-layer protective film are sequentially laminated to a lower surface of the copper foil base layer from inside to outside; and then, pseudo hot-pressing is performed on an upper layer of the semi-finished product at a temperature of 60-130° C., while normaltemperature and low pressure are applied tothe other side. Hot-pressing is performed at a temperature of 60-130° C. on upper and lower sides of the semi-finished product with either side laminated with the upper coverlay and upper-layer protective film or the lower coverlay and lower-layer protective film. Further, the plasma cleaning is used for activated cleaning. The operation in S2 facilitates removal of bubbles in the semi-finished product.

In S4, combinational hot-pressing is performed on the semi-finished product treated in S3. In S4, the upper-layer protective film and the lower-layer protective film of the semi-finished product treated in S3 are removed; then, an upper auxiliary hot-press film and a lower auxiliary hot-press film are laminated to upper and lower sides, respectively, a finished-product hot-pressing operation is then performed, and the upper auxiliary hot-press film and the lower auxiliary hot-press film are removed from the semi-finished product subjected to the finished-product hot-pressing operation, wherein finished-product hot-pressing is performed at a temperature of 120-200° C. within a pressure range of 70-150 kg.

In S5, a windowing operation is performed on the semi-finished product treated in S4 to expose soldering points of the copper foil base layer.

The process further includes S6 following S5, and in S6, an image of the semi-finished product treated in S5 is taken and transmitted to an image mechanism for inspection, and the inspected finished product is then coded and discharged. The inspection at the image mechanism includes inspecting the appearance of the product by image comparison or observation.

Embodiment 2

On the basis of Embodiment 1, the matt film includes a polyester thin film, which is provided with a heat-blocking base film, and a high-temperature-resistant adhesive layer is disposed between the polyester thin film and the heat-blocking base film.

And/or, the bilayer protective film includes a base film and a polyester thin film, and a high-temperature-resistant adhesive layer is disposed between the base film and the polyester thin film. In this way, the bilayer protective film can serve as a carrier for conveying the copper foil base layer to help to apply the force of pressing during pressing and air bubble removing, thereby enhancing the hardness of the copper foil base layer during production and protecting the surface of a product from risks of scratches and dirt.

And/or, thermosensitive adhesive film layers are used as the lower coverlay and the upper coverlay. Further, a thermosensitive adhesive film product in the prior art may be directly used as the thermosensitive layer. After combinational hot-pressing, the lower and upper coverlays form CVL layers wrapping outside the copper foil base layer.

And/or, polyester thin films are used as backings for the lower-layer and upper-layer protective films and the monolayer protective film, and acrylic adhesive layers are applied to one side of each of the lower-layer and upper-layer protective films and of the monolayer protective film. The lower-layer and upper-layer protective films function to enhance the hardness of the product during production, and protect the surface of the product from risks of scratches and dirt.

And/or, polyester thin films are used as backings for the upper and lower auxiliary hot-press films, and a release agent is applied to either side of the upper and lower auxiliary hot-press films. The upper and lower auxiliary hot-pressing films are anti-sticking and can prevent a hot-pressed product from sticking to a press plate of press equipment.

Embodiment 3

As shown in FIG. 1 to FIG. 7, on the basis of Embodiment 1 or Embodiment 2, a system for manufacturing a flexible laser circuit board is used. The system for manufacturing a flexible laser circuit board includes a loading/film pre-laminating module 1, a laser etching module 2, a scrap-removing/pseudo-lamination hot-pressing module 3, a combinational hot-pressing module 4, a laser windowing module 5, and a scrap-removing/coding/checking/discharging module 6, which are sequentially arranged according to working procedures.

The loading/film pre-laminating module 1 includes a first conveying passage as well as a plurality of first feeding rollers and first film removing rollers, which correspond to the first conveying passage; and a first induced draft mechanism is further disposed on the first conveying passage. The copper foil base layer is introduced into the loading/film pre-laminating module for an operation in S1.

Specifically, the plurality of first feeding rollers includes a copper foil base layer feeding roller 13, a matt film feeding roller 14, a bilayer protective film feeding roller 11 disposed on a loading side of the first conveying passage, and a monolayer protective film feeding roller 16 disposed below the first conveying passage, where the copper foil base layer feeding roller 13 and the matt film feeding roller 14 are disposed above the first conveying passage and sequentially arranged in a conveying sequence; and the plurality of first film removing rollers are configured to remove scraps on the raw bilayer protective film and on the raw matt film. With such an arrangement, the copper foil base layer can be carried on the protective layer all the time and conveyed to a next working procedure, to thereby improve the smoothness and convenience during machining.

The laser etching module 2 includes a second conveying passage; a first induced draft conveying platform is disposed on the second conveying passage; and a laser etching machine corresponding to the first induced draft conveying platform is disposed on the first induced draft conveying platform. The semi-finished product treated in S1 is led out from the loading/film pre-laminating module 1 and conveyed into the laser etching module 2 for an operation in S2.

The scrap-removing/pseudo-lamination hot-pressing module 3 includes a third conveying passage, a plurality of third feeding rollers and third film removing rollers, a lower-layer hot-pressing roller set for implementing lower-layer pseudo hot-pressing, an upper-layer hot-pressing roller set for implementing upper-layer pseudo hot-pressing, and a bilateral hot-pressing roller set for implementing hot-pressing on upper and lower sides, where the third feeding rollers and the third film removing rollers correspond to the third conveying passage. The semi-finished product treated in S1 is led out from the laser etching module 2 and conveyed into the scrap-removing/pseudo-lamination hot-pressing module 3 for an operation in S3.

Specifically, the plurality of third feeding rollers and the plurality of third film removing rollers include: a matt film scrap removing roller 311, a scrap-removing adhesive tape feeding roller 31, a product scrap film removing roller 32, an upper coverlay feeding roller 33, and an upper-layer protective film feeding roller 35, which are disposed above the fourth conveying passage; and a monolayer protective film scrap removing roller 310, a bilayer protective film scrap removing roller 39, a lower coverlay feeding roller 38, and a lower-layer protective film feeding roller 37, which are disposed below the fourth conveying passage. Moreover, the upper-layer hot-pressing roller set includes an upper roller and a lower roller, which are vertically arranged side by side and can press each other, and the upper roller has a heating function. Moreover, the lower-layer hot-pressing roller set includes an upper roller and a lower roller, which are vertically arranged side by side and can press each other, and the lower roller has a heating function.

The combinational hot-pressing module 4 includes a fourth conveying passage, a plurality of fourth feeding rollers and fourth film removing rollers, and a split type finished-product hot-pressing mechanism for implementing finished-product hot-pressing, where the fourth feeding rollers and fourth film removing rollers correspond to the fourth conveying passage. The semi-finished product treated in S3 is led out from the scrap-removing/pseudo-lamination hot-pressing module 3 and conveyed to the combinational hot-pressing module 4 for an operation in S4.

Specifically, the plurality of fourth film removing rollers and fourth feeding rollers includes an upper-layer protective film scrap removing roller 41, an upper auxiliary hot-press film feeding roller 44, and an upper auxiliary hot-press film removing roller 45, which are disposed above the fourth conveying passage; and a lower-layer protective film scrap removing roller 42, a lower auxiliary hot-press film feeding roller 43, and a lower auxiliary hot-press film removing roller 46, which are disposed below the fourth conveying passage.

The laser windowing module 5 includes a fifth conveying passage and a laser windowing machine corresponding to the fifth conveying passage. The semi-finished product treated in S4 is led out from the combinational hot-pressing module 4 and conveyed to the laser windowing module 5 for an operation in S5. Here, during the windowing operation, the soldering points of the copper foil base layer are exposed by means of laser etching.

The scrap-removing/coding/checking/discharging module 6 includes a sixth conveying passage, as well as an image mechanism inspection mechanism, a coding mechanism, and a plurality to sixth scrap-removing rollers, all of which correspond to the sixth conveying passage. The semi-finished product treated in S5 is led out from the laser windowing module 5 and conveyed to the scrap-removing/coding/checking/discharging module 6 for an operation in S6.

Working Principle

As shown in FIG. 1 to FIG. 7, the system and process for manufacturing a flexible circuit board by laser cutting are directed to LDCs. By manufacturing the flexible circuit board by laser cutting, the present invention can optimize the machining convenience and environmental friendliness of the flexible circuit board, improve the product performance of the flexible circuit board and prolong the service life of the flexible circuit board. During production, the copper foil base layer carried between the bilayer protective film and the matt film is conveyed to stations in S2 and S3 by means of the conveying processes in S1 to S2 where the matt film the bilayer protective film and the monolayer protective film are taken as carriers. In S3, the matt film and the monolayer protective film are removed, the upper coverlay and the upper-layer protective film are then laminated, the bilayer protective film is removed, and the lower coverlay and the lower-layer protective film are then laminated, such that the conveying during machining is facilitated on the one hand, and on the other hand, the lower-layer and upper-layer protective films can enhance the hardness of the product during production and protect the surface of the product from risks of scratches and dirt. During the subsequent hot-pressing, the anti-sticking upper and lower auxiliary hot-press films are laminated to the outer sides of the upper and lower coverlays, such that the product is prevented from sticking to the press plate after hot-pressing. Meanwhile, the upper and lower coverlays on the outer side of the hot-pressed copper foil base layer are heated to form a CVL layer attached to the exterior of the copper foil base layer. Here, CVL is the shortened form of coverlay. A product manufactured according to the technical solution of the present invention includes the copper foil base layer and the CVL layer attached to the exterior of the copper foil base layer, and the correspondingly arranged soldering points on the copper foil base layer in the product are exposed out of the CVL layer.

As shown in FIG. 8, compared with the appearance of a flexible circuit board machined by the prior art, the appearance according to a preferred embodiment of the present invention is well-defined and level without notches or blackened circuit edges and without metal particles on the surface. However, in the prior art, a fuse cannot be die-cut and molded by rotary die cutting, and circuit edges may be indented and collapsed and at the risk of puncture during slice analysis.

Figure 10:
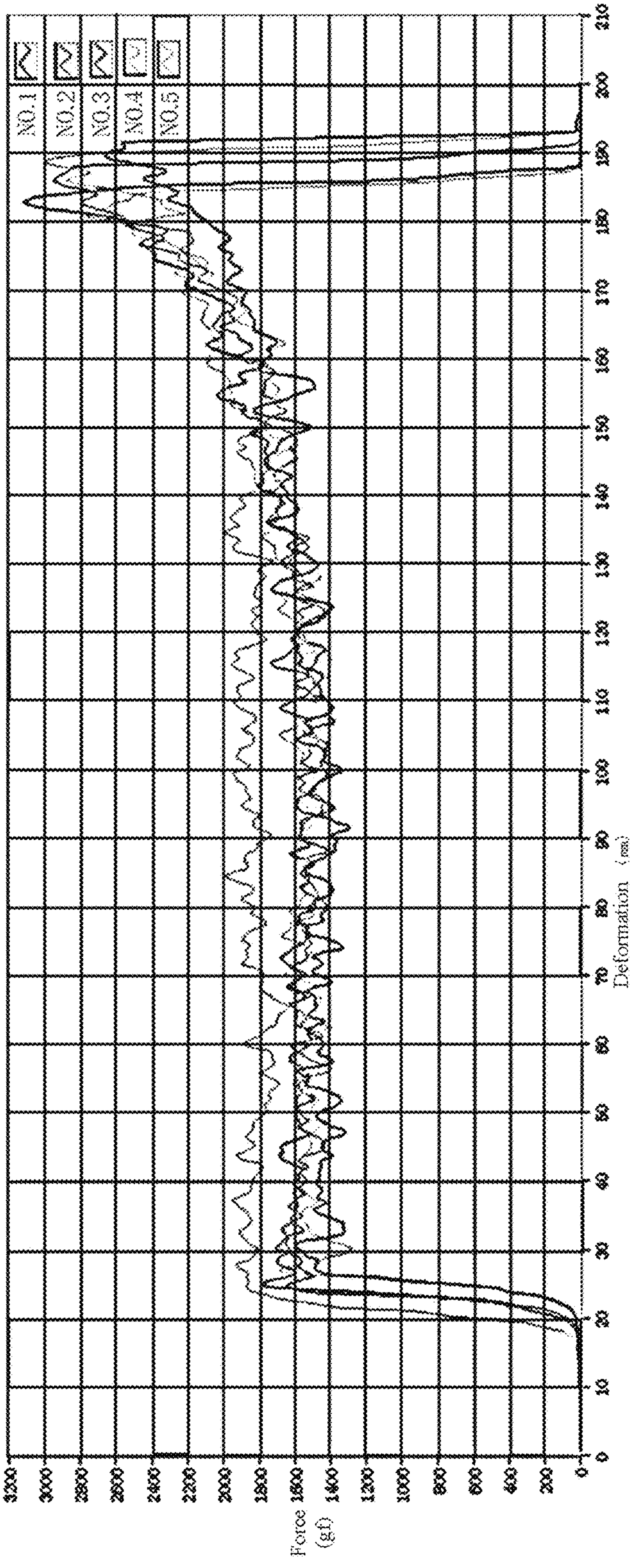
FIG. 10 shows a curve map corresponding to peel strength according to a preferred embodiment of the present invention.

The peel strength of the product manufactured according to the technical solution of the present invention is shown in FIG. 9, in which a 180-degree peel strength test is performed using a tensile machine on the CVL layer and the copper foil base layer in the product manufactured according to the technical solution of the present application. That is, the peel test is performed by peeling the CVL layer in a U-shaped peel direction with respect to the copper foil base layer. From the test table shown in FIG. 9 and the curve map corresponding to the peel strength shown in FIG. 10, it can be seen that the test standard is greater than 1000 gf/em, and the actual mean is 1514 gf/cm, meeting the test standard for peel strength of the flexible circuit board.

The conduction property of the product manufactured according to the technical solution of the present invention is shown in the conduction property test table in FIG. 11, in which constant current sources are used for testing. Among the test parameters, the constant current sources are each of 1 A and 7 A; and the fusing state of a fuse in the copper foil base layer in the product is determined. The maximum fusing time is 0.72 seconds at the current of 7 A, and the overcurrent time is more than 300 seconds at the current of 1 A.

Figure 13:
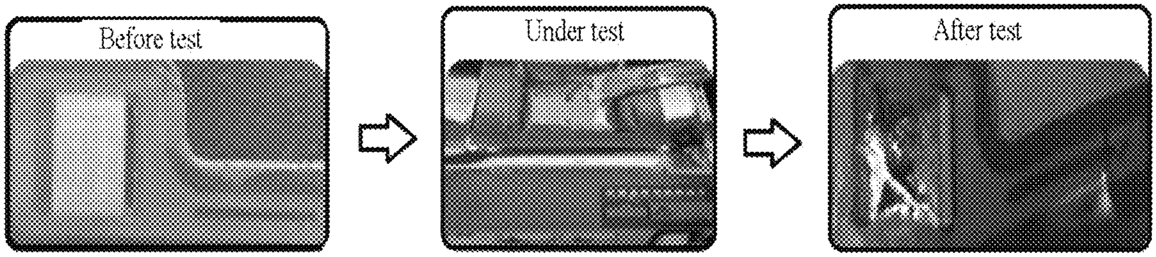
FIG. 13 shows a state diagram of a solder float test for a product manufactured according to a preferred embodiment of the present invention.
Figure 14:
FIG. 14 shows a schematic section view of a layer structure of a product manufactured according to the present invention, in which: 1—loading/film pre-laminating module, 11—bilayer protective feeding roller, 13—coper foil base layer feeding roller, 14—matt film feeding roller, 16 monolayer protective film feeding roller, 2—laser etching module, 3 scrap-removing/pseudo-lamination hot-pressing module, 31—scrap-removing/adhesive tape feeding roller, 32—product scrap film removing roller, 33—upper coverlay feeding roller, 35—upper-layer protective film feeding roller, 37—lower-layer protective film feeding roller, 38—lower coverlay feeding roller, 39—bilayer protective film scrap removing roller, 310—monolayer protective film scrap removing roller, 311—matt film scrap removing roller, 4—combinational hot-pressing module, 41—upper-layer protective film scrap removing roller, 42—lower-layer protective film scrap removing roller, 43—lower auxiliary hot-press film feeding roller, 44—upper auxiliary hot-press film feeding roller, 45—upper auxiliary hot-press film removing roller, 46—lower auxiliary hot-press film: removing roller, 5—laser windowing module, 6—scrap-removing/marking/checking/discharging module, a—copper foil base layer, b—VLC layer.

For the solder float test conducted on the product manufactured according to the technical solution of the present invention, the state photo of each stage is shown in FIG. 13. The product was placed in a lead-free tin furnace at a temperature of 260-5° C., and was immersed for 10±1 sec. Then, the product under test was tested, showing that the circuit on a copper foil substrate in the tested product has good bondability with the CVL layer without detachment and air bubbles. Moreover, the tin coverage is greater than or equal to 95% on the bonding pad.

In the bending test conducted on the product manufactured according to the technical solution of the present invention, the number of bending times is 5000, at an angle of ±135°. The circuit on the copper foil substrate in the product manufactured according to the present invention has good CVLbondability without detachment, cracking, and open circuit, and shows normal conduction after bending, with resistance variation less than 20%.

In the thermal shock test conducted on the product manufactured according to the technical solution of the present invention, the product was placed in a thermal shock test chamber under the following test conditions: low temperature: −40° C., for 45 min; high temperature: 125° C., for 45 min; and 100 cycles. The circuit on the copper foil substrate in the product manufactured according to the present invention has good CVLbondability without detachment, cracking, and open circuit, and shows normal conduction after bending, with resistance variation less than 20%.

In the constant temperature and humidity test conducted on the product manufactured according to the technical solution of the present invention, the product was placed in a constant temperature and humidity test chamber under the following test conditions: temperature: 85±2° C., humidity: 85±2% RH, for 1008 h. The circuit on the copper foil substrate in the product manufactured according to the present invention has good bondability with CVL without detachment, cracking, and open circuit, and shows normal conduction after bending, with resistance variation less than 20%.

In the salt spray test conducted on the product manufactured according to the technical solution of the present invention, the product was placed in a salt spray tester (Model: AOS-108) under the following test conditions: temperature: 35±2° C., saturated bucket temperature: 47±2° C.; concentration of NaCl solution: 50 g/L±5 g/L; PH of solution: 6.5-7.2; salt spray settlement: 1-2 ml/80 $CM^2$ per hour. The test time was 48 h. After the test, the product was tested to show normal conduction in the circuit of the product.

Without departing from the scope of technical concept of the present invention, those skilled in the art can make a variety of variations and modifications by means of the above description under the enlightenment of the ideal embodiments of the present invention. The technical scope of the present invention is not limited to the content of the specification, and should be determined according to the scope of the claims.

What is claimed is:

1. A process for manufacturing a flexible circuit board by laser cutting, comprising the steps of:

S1, loading and adding protective layers, introducing a copper foil base layer, and laminating the protective layers to upper and lower surfaces of the copper foil base layer, respectively, to form a laminated structure;

S2, performing laser cutting on the laminated structure in S1 to form a circuit structure;

S3, performing scrap removal, activated cleaning, and lamination hot-pressing of an upper coverlay and a lower coverlay on the circuit structure in S2;

S4, performing hot-pressing on the circuit structure in S3; and

S5, performing a windowing operation on the circuit structure in S4 to expose soldering points of the copper foil base layer, thereby forming the flexible circuit board.

2. The process for manufacturing a flexible circuit board by laser cutting according to claim 1, wherein in S1, the protective layers comprise a matt film or a bilayer protective film or a monolayer protective film; and with the bilayer protective film as a backing, the copper foil base layer is laminated to an upper surface of the bilayer protective film, and the matt film is then laminated on the copper foil base layer, and the monolayer protective film is laminated to a lower side of the bilayer protective film.

3. The process for manufacturing a flexible circuit board by laser cutting according to claim 2, wherein in S3, the matt film, copper foil scraps, and the monolayer protective film are removed from the circuit structure in S2; then, activated cleaning is performed on an outer surface of the copper foil base layer in the circuit structure, and the upper coverlay and an upper-layer protective film are sequentially laminated to an upper surface of the copper foil base layer from inside to outside; and then, hot-pressing is performed on a lower layer of the circuit structure at a temperature of 60-130° C.

4. The process for manufacturing a flexible circuit board by laser cutting according to claim 3, wherein in S3, the bilayer protective film is removed from the lower layer of the circuit structure subjected to the hot-pressing; then, activated cleaning is performed on the lower surface of the copper foil base layer in the circuit structure, and the lower coverlay and a lower-layer protective film are sequentially laminated to a lower surface of the copper foil base layer from inside to outside; and then, hot-pressing is performed on an upper layer of the circuit structure at a temperature of 60-130° C.

5. The process for manufacturing a flexible circuit board by laser cutting according to claim 4, wherein in S3, hot-pressing is performed at a temperature of 60-130° C. on upper and lower sides of the circuit structure with either side laminated with the upper coverlay and the upper-layer protective film or the lower coverlay and a lower-layer protective film.

6. The process for manufacturing a flexible circuit board by laser cutting according to claim 5, wherein in S4, the upper-layer protective film and the lower-layer protective film of the circuit structure in S3 are removed; then, an upper auxiliary hot-press film and a lower auxiliary hot-press film are laminated to upper and lower sides, respectively, a hot-pressing operation is then performed, and the upper auxiliary hot-press film and the lower auxiliary hot-press film are removed from the circuit structure subjected to the hot-pressing operation, wherein the hot-pressing is performed for 120-180 seconds at a temperature of 120-200° C. within a pressure range of 70-150 kg.

7. The process for manufacturing a flexible circuit board by laser cutting according to claim 1, wherein the process further comprises S6 following S5; and in S6, an image of the flexible circuit board in S5 is taken and transmitted to an image mechanism for inspection, and the inspected flexible circuit board is then coded and discharged.

8. The process for manufacturing a flexible circuit board by laser cutting according to claim 7, wherein a system for manufacturing a flexible laser circuit board is used, and comprises a loading/film pre-laminating module, a laser etching module, a scrap-removing/lamination hot-pressing module, a hot-pressing module, a laser windowing module, and a scrap-removing/coding/checking/discharging module, which are sequentially arranged according to working procedures;

the copper foil base layer is introduced into the loading/film pre-laminating module for an operation in S1;

the laminated structure in S1 is led out from the loading/film pre-laminating module and conveyed into the laser etching module for an operation in S2;

the circuit structure in S2 is then led out from the laser etching module and conveyed into the scrap-removing/lamination hot-pressing module for an operation in S3;

the circuit structure in S3 is then led out from the scrap-removing/lamination hot-pressing module and conveyed to the hot-pressing module for an operation in S4;

the circuit structure in S4 is then led out from the hot-pressing module and conveyed to the laser windowing module for an operation in S5; and the flexible circuit board in S5 is then led out from the laser windowing module and conveyed to the scrap-removing/coding/checking/discharging module for an operation in S6.

9. The process for manufacturing a flexible circuit board by laser cutting according to claim 8, wherein the loading/film pre-laminating module comprises a first conveying passage as well as a plurality of first feeding rollers and first film removing rollers, wherein the first feeding rollers and the first film removing rollers correspond to the first conveying passage, and a first induced draft mechanism is further disposed on the first conveying passage;

and/or, the laser etching module comprises a second conveying passage, wherein a first induced draft conveying platform is disposed on the second conveying passage, and a laser etching machine corresponding to the first induced draft conveying platform is disposed on the first induced draft conveying platform;

and/or, the scrap-removing/lamination hot-pressing module comprises a third conveying passage, a plurality of third feeding rollers and third film removing rollers, a lower-layer hot-pressing roller set for implementing lower-layer hot-pressing, an upper-layer hot-pressing roller set for implementing upper-layer hot-pressing, and a bilateral hot-pressing roller set for implementing hot-pressing on upper and lower sides, wherein the third feeding rollers and the third film removing rollers correspond to the third conveying passage;

and/or, the hot-pressing module comprises a fourth conveying passage, a plurality of fourth feeding rollers and fourth film removing rollers, and a finished-product hot-pressing mechanism for implementing finished-product hot-pressing, wherein the fourth feeding rollers and fourth film removing rollers correspond to the fourth conveying passage;

and/or, the laser windowing module comprises a fifth conveying passage and a laser windowing machine corresponding to the fifth conveying passage; and and/or, the scrap-removing/coding/checking/discharging module comprises a sixth conveying passage, as well as an image mechanism inspection mechanism, a coding mechanism, and a plurality to sixth scrap-removing rollers, all of which correspond to the sixth conveying passage.

10. The process for manufacturing a flexible circuit board by laser cutting according to claim 6, wherein the matt film comprises a polyester thin film, which is provided with a heat-blocking base film, and a high-temperature-resistant adhesive layer is disposed between the polyester thin film and the heat-blocking base film;

and/or, the bilayer protective film comprises a base film and a polyester thin film, and a high-temperature-resistant adhesive layer is disposed between the base film and the polyester thin film;

and/or, thermosensitive adhesive film layers are used as the lower coverlay and the upper coverlay;

and/or, polyester thin films are used as backings for the lower-layer protective film and the upper-layer protective film and the monolayer protective film, and acrylic adhesive layers are applied to one side of each of the lower-layer protective film and the upper-layer protective film and of the monolayer protective film;

and/or, polyester thin films are used as backings for the upper and lower auxiliary hot-press films, and release agent layers are applied to either side of the upper and lower auxiliary hot-press films.

* * * * *